(12) United States Patent
Schulze et al.

(10) Patent No.: US 8,293,636 B2
(45) Date of Patent: Oct. 23, 2012

(54) CONDUCTIVE CONNECTION STRUCTURE WITH STRESS REDUCTION ARRANGEMENT FOR A SEMICONDUCTOR DEVICE, AND RELATED FABRICATION METHOD

(75) Inventors: Thomas Schulze, Wilthen (DE); Frank Kuechenmeister, Dresden (DE); Michael Su, Round Rock, TX (US); Lei Fu, Austin, TX (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 81 days.

(21) Appl. No.: 12/862,255

(22) Filed: Aug. 24, 2010

(65) Prior Publication Data

US 2012/0049343 A1    Mar. 1, 2012

(51) Int. Cl.
*H01L 21/44* (2006.01)
(52) U.S. Cl. ............... 438/614; 257/738; 257/E21.522
(58) Field of Classification Search .............. 257/783, 257/E21.522; 438/612, 614
See application file for complete search history.

(56) References Cited

U.S. PATENT DOCUMENTS

| | | | |
|---|---|---|---|
| 7,491,556 B2 * | 2/2009 | Jungnickel et al. | 438/15 |
| 7,569,937 B2 * | 8/2009 | Kuechenmeister et al. | 257/762 |
| 7,936,075 B2 * | 5/2011 | Eda | 257/783 |
| 2008/0241992 A1 * | 10/2008 | Lin et al. | 438/106 |
| 2009/0189286 A1 | 7/2009 | Daubenspeck et al. | |
| 2011/0186987 A1 * | 8/2011 | Wang et al. | 257/737 |

* cited by examiner

*Primary Examiner* — Fernando L Toledo
*Assistant Examiner* — John C Ingham
(74) *Attorney, Agent, or Firm* — Ingrassia Fisher & Lorenz, P.C.

(57) ABSTRACT

A semiconductor device disclosed herein includes a conductive connection structure having a stepped profile that serves as a stress relief feature. The conductive connection structure includes a stress buffer arrangement for a contact pad. The stress buffer arrangement has a stepped via that terminates at the contact pad, and the stepped via has a plurality of inwardly sloped and concentric sections in a stacked orientation. The connection structure also includes underbump metallization overlying at least a portion of the contact pad and lining the stepped via, and a conductive connection element coupled to the underbump metallization. The conductive connection element fills the lined recess.

4 Claims, 6 Drawing Sheets

CONDUCTIVE CONNECTION STRUCTURE WITH STRESS REDUCTION ARRANGEMENT FOR A SEMICONDUCTOR DEVICE, AND RELATED FABRICATION METHOD

TECHNICAL FIELD

Embodiments of the subject matter described herein relate generally to semiconductor devices and associated manufacturing processes. More particularly, embodiments of the subject matter relate to a conductive connection structure (suitable for solder bumps and conductive metal pillars) having improved stress reduction characteristics.

BACKGROUND

Semiconductor devices, integrated circuits, and related manufacturing and packaging techniques and processes are well known. A typical integrated circuit device includes a semiconductor device structure (e.g., a chip) that is packaged with appropriate leads and terminals for connecting the chip circuitry with the next assembly level, such as a circuit board, a carrier substrate, or the like. Some packaging approaches use conductive connection elements, such as solder bumps or copper pillars, that are electrically coupled to respective contact pads of the semiconductor device structure. The conductive connection elements are used to establish physical and electrical connections between the semiconductor device structure and the next level package component. Due to the different thermal expansion (and contraction) properties of the chip versus the package, care must be taken to ensure that the electrical connections remain intact and that thermal expansion and contraction do not damage the chip.

The microelectronic industry strives to create semiconductor devices having increased functionality and compact size. For example, to improve electrical performance of semiconductor devices, materials with low or ultra low dielectric constants (i.e., low-k or ULK materials) are being used as isolating material in multilayer backend stacks. This isolating material is often referred to as interlayer dielectric or ILD material. Unfortunately, the low-k and ULK materials typically used in semiconductor device fabrication are fragile and brittle. Accordingly, using such ILD material presents certain challenges for assembly yield and product reliability. Furthermore, the use of lead-free solder material usually results in much higher stress, due to the higher stiffness of lead-free materials relative to lead-based solder material. Thus, solder bumps formed from stiffer material can transfer more stress (associated with thermal expansion or contraction) to the ILD material of the semiconductor device structure.

Accordingly, it is desirable to have a conductive connection structure or architecture that addresses the limitations and shortcomings of conventional designs. In particular, it is desirable to have a solder bump structure that is suitable for use with lead-free solder material and for chips that use low-k and/or ULK material for the ILD.

BRIEF SUMMARY

A method of fabricating a semiconductor device is provided. The method begins by forming a semiconductor device structure having a contact pad. The method continues by forming a layer of passivation material overlying the semiconductor device structure and overlying the contact pad, forming a layer of first stress buffering material overlying the layer of passivation material, and forming a layer of second stress buffering material overlying the layer of first stress buffering material. Next, some of the second stress buffering material and some of the first stress buffering material are removed to expose a portion of the layer of passivation material, resulting in a recess having a stepped cross-sectional profile. The exposed layer of passivation material is etched using the first stress buffering material, the second stress buffering material, and the recess as an etch mask, to expose at least a portion of the contact pad. Thereafter, a conductive connection element is formed overlying the recess.

Also provided is a semiconductor device having a semiconductor device structure comprising a contact pad, a passivation layer overlying the semiconductor device structure and having a first via formed therein, the first via terminating at the contact pad. The semiconductor device also has a lower stress buffer layer overlying the passivation layer and having a second via formed therein, the second via extending to the first via, and an upper stress buffer layer overlying the lower stress buffer layer and having a third via formed therein, the third via extending to the second via. The contact pad, the first via, the second via, and the third via together define a recess having a stepped cross-sectional profile. The device also includes underbump metallization that lines the recess, the underbump metallization defining a lined recess, and a conductive connection element coupled to the underbump metallization, the conductive connection element filling the lined recess.

A conductive connection structure for a semiconductor device is also provided. The conductive connection structure includes a stress buffer arrangement for a contact pad of the semiconductor device, the stress buffer arrangement comprising a stepped via that terminates at the contact pad, the stepped via having a plurality of inwardly sloped and concentric sections in a stacked orientation. The conductive connection structure also includes underbump metallization overlying at least a portion of the contact pad and lining the stepped via, the underbump metallization defining a lined recess for the contact pad, and a conductive connection element coupled to the underbump metallization, the conductive connection element filling the lined recess.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
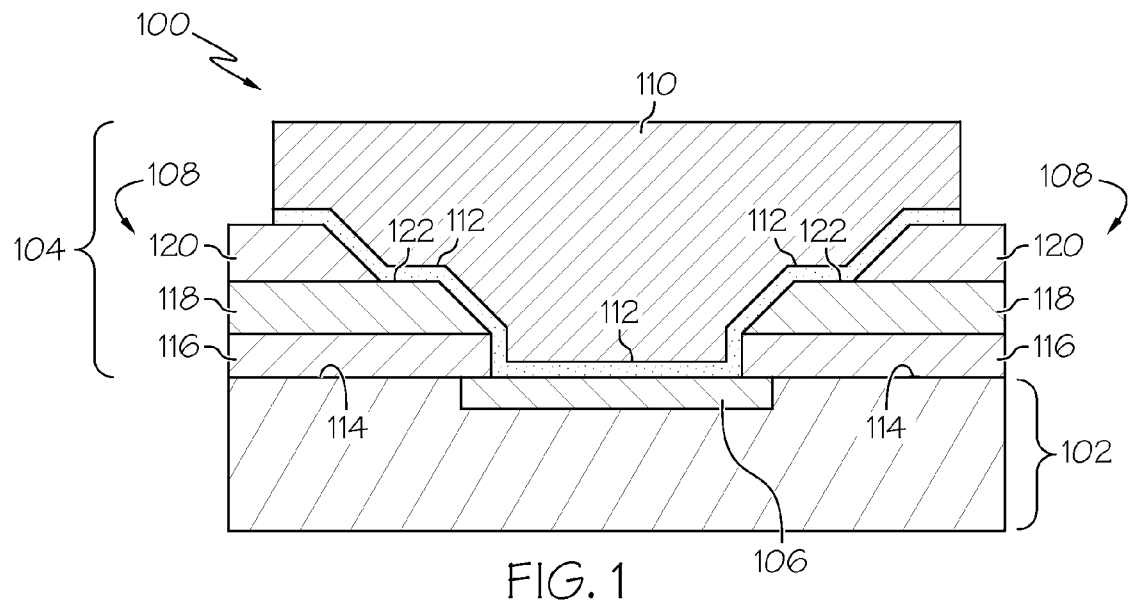
FIG. 1 is a cross-sectional view of an exemplary embodiment of a semiconductor device.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device and integrated circuit chip fabrication and may not be described in detail herein. Moreover, the various tasks and process steps described herein may be incorporated into a more comprehensive procedure or process having additional steps or functionality not described in detail herein. In particular, various integrated circuit manufacturing and packaging steps are well known and so, in the interest of brevity, many conventional steps will only be mentioned briefly herein or will be omitted entirely without providing the well known process details.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of features or elements within a consistent but arbitrary frame of reference which is made clear by reference to the text and the associated drawings describing the features and elements under discussion. Such terminology may include the words specifically mentioned above, derivatives thereof, and words of similar import. Similarly, the terms "first", "second", and other such numerical terms referring to structures do not imply a sequence or order unless clearly indicated by the context.

First Embodiment

FIG. 1 is a cross-sectional view of an exemplary embodiment of a semiconductor device 100 that includes a semiconductor device structure 102 and a conductive connection structure 104 for the semiconductor device structure 102. Note that only a small portion of the semiconductor device 100 is shown in FIG. 1 (a realistic embodiment could include many conductive connection structures 104 arranged in an appropriate matrix or pattern). The semiconductor device structure 102 may be formed using conventional and well known semiconductor process technologies. In this regard, the semiconductor device structure 102 will typically include a support substrate, semiconductor material, dielectric material, and metal material in different layers (forming features such as transistors, conductive interconnects, isolation regions, conductive plugs, ILD, and the like). The semiconductor device structure 102 also includes a number of conductive contact pads that represent electrical connection points, terminals, ports, nodes, or the like. For simplicity and ease of description, FIG. 1 depicts only one contact pad 106. In practice, the contact pad 106 may be realized as part of the upper contact layer or contact architecture of the semiconductor device structure 102. In accordance with conventional semiconductor device fabrication processes, the contact pad 106 is formed from the uppermost or "highest" metal layer of the semiconductor device structure 102.

Although not always required, the contact pad 106 is rectangular in shape when viewed from the top or bottom. In certain implementations, the contact pad 106 is square in shape when viewed from the top or bottom (see FIG. 3, which depicts the contact pad 106 in dashed lines). The contact pad 106 is formed from an electrically conductive material, typically including a metal such as aluminum, copper, copper alloys, and the like.

The conductive connection structure 104 generally includes, without limitation: a stress buffer arrangement 108 for the contact pad 106; a conductive connection element 110; and underbump metallization 112 between the stress buffer arrangement 108 and the conductive connection element 110. The underbump metallization 112 follows the contour of the upper surface of the stress buffer arrangement 108, and the underbump metallization 112 is electrically coupled to the upper surface of the contact pad 106. The underbump metallization 112 facilitates the physical and electrical coupling of the conductive connection element 110 to the contact pad 106.

The stress buffer arrangement 108 is formed overlying the upper surface 114 of the semiconductor device structure 102. In certain embodiments (such as the one shown in FIG. 1), a portion of the stress buffer arrangement 108 is formed overlying some of the contact pad 106. More specifically, some of the stress buffer arrangement 108 overlaps the outer perimeter of the contact pad 106. For this particular embodiment, the stress buffer arrangement 108 is formed from at least three layers or components: a passivation layer 116; a lower stress buffer layer 118; and an upper stress buffer layer 120.

The passivation layer 116 may be realized using one or more layers of material such as, without limitation, silicon dioxide or silicon nitride. In practice, the passivation layer 116 is formed overlying the semiconductor device structure 102, and it overlaps the outer portion of the contact pad 106, as shown in FIG. 1. The thickness of the passivation layer 116 is typically within the range of about 500 nm to 3,000 nm. The lower stress buffer layer 118 is preferably formed from one or more layers of polyimide material overlying some or all of the passivation layer 116. The thickness of the lower stress buffer layer 118 is typically within the range of about 1 μm to about 12 μm. Similarly, the upper stress buffer layer 120 is preferably formed from one or more layers of polyimide material. The thickness of the upper stress buffer layer 120 is typically within the range of about 1 μm to about 12 μm, and the thickness of the upper stress buffer layer 120 need not be the same as the lower stress buffer layer 118. In certain embodiments, bisbenzocyclobutene (BCB) electronic resin material could be used instead of polyimide for one or both of the stress buffer layers 118, 120. Other potential materials suitable for use as one or both of the stress buffer layers 118, 120 include, without limitation: polybenzobisoxazole (PBO), polybenzobisthiazole (PBT), or novolac.

In preferred embodiments, the upper stress buffer layer 120 is located overlying some, but not all, of the lower stress buffer layer 118. This characteristic is shown in FIG. 1, where an upper shelf 122 of the lower stress buffer layer 118 remains uncovered by the upper stress buffer layer 120. Depending upon the embodiment, the upper stress buffer layer 120 and the lower stress buffer layer 118 could be composed of the same polyimide material or different types of polyimide materials having different mechanical properties. The polyimide material serves as a cushion for the conductive connection element 110, and provides stress relief between the conductive connection element 110 and the underlying material and layers of the semiconductor device structure 102.

The underbump metallization 112 lines a recess that is defined by the stress buffer arrangement 108 and the upper surface of the contact pad 106, as shown in FIG. 1. Thus, a portion of the underbump metallization 112 overlies the contact pad 106. Although the underbump metallization 112 is depicted as a single layer in the figures, it could be realized using any number of layers. For example, the underbump metallization 112 could include an adhesion layer, a barrier layer, and a current distribution layer in a stacked arrangement.

The conductive connection element 110 is physically and electrically coupled to the underbump metallization 112. In certain embodiments, the conductive connection element 110 is realized as a solder bump that fills the lined recess. The solder bump could be formed from lead-free materials such as SnAg, SnCu, or SnAgCu, without limitation. In other embodiments, the conductive connection element 110 is realized as a conductive pillar, such as a copper (or other metal) pillar.

Figure 2:
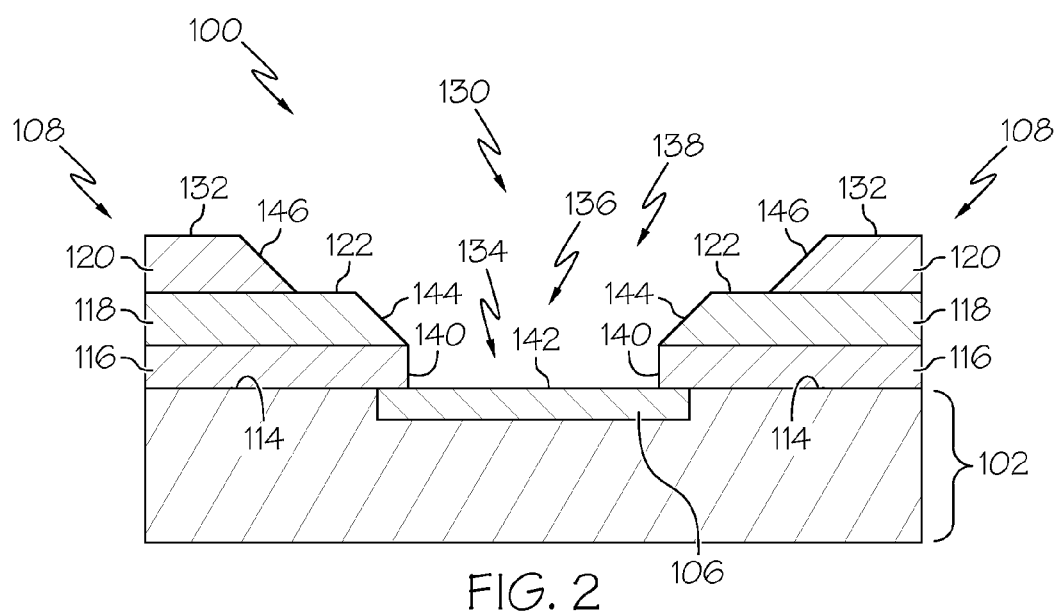
FIG. 2 is a cross-sectional view of a portion of the semiconductor device shown in FIG. 1.

FIG. 2 is a cross-sectional view of the semiconductor device 100, without the conductive connection element 110 or the underbump metallization 112. FIG. 2 shows that the stress buffer arrangement 108 has a stepped via 130 formed therein; the stepped via 130 extends from an upper surface 132 of the stress buffer arrangement 108 and it terminates at the contact pad 106. For this particular embodiment, the stepped via 130 includes three sections: a lower section defined in the passivation layer 116; an intermediate section defined in the lower stress buffer layer 118; and an upper section defined in the upper stress buffer layer 120. In this regard, the passivation layer 116 has a via 134 formed therein (which corresponds to the lower section of the stepped via 130), the lower stress buffer layer 118 has a via 136 formed therein (which corresponds to the intermediate section of the stepped via 130), and the upper stress buffer layer 120 has a via 138 formed therein (which corresponds to the upper section of the stepped via 130). The via 138 formed in the upper stress buffer layer 120 begins at the upper surface 132 of the stress buffer arrangement 108, and it extends to (and is continuous with) the via 136. The via 136 formed in the lower stress buffer layer 118 extends to (and is continuous with) the via 134, which terminates at the contact pad 106.

The via 134 formed in the passivation layer 116 has a straight sidewall 140 that is orthogonal to the upper surface 142 of the contact pad 106. In contrast, the via 136 in the lower stress buffer layer 118 has an inwardly sloped sidewall 144 (in other words, its upper section is wider than its lower section). Likewise, the via 138 in the upper stress buffer layer 120 has an inwardly sloped sidewall 146 (in other words, its upper section is wider than its lower section). In practice, the slope of the sidewalls 144, 146 will be within the range of about 20 to 80 degrees, and preferably about 40 degrees, and the slopes need not be the same. For this particular embodiment, the contact pad 106, the via 134 in the passivation layer 116, the via 136 in the lower stress buffer layer 118, and the via 138 in the upper stress buffer layer 120 together define a recess having a stepped cross-sectional profile. In other words, the transition from the upper rim of the recess to the contact pad 106 includes a plurality of discontinuous steps or segments, and the transition does not simply follow a straight line path to the contact pad 106. This stepped profile enhances the stress relieving properties and characteristics of the stress buffer arrangement 108 by increasing and distributing the "corners" that tend to concentrate stresses.

The dimensions, layout, and material composition of the conductive connection structure 104 can be chosen according to the desired amount of stress relief, the type of solder or pillar material, the anticipated operating environment, the layout of conductive connection elements on the semiconductor device 100, and the like. In this regard, any number of the following parameters could be adjusted as needed to influence the stress relieving properties of the conductive connection structure, without limitation: the thickness of the passivation layer 116; the material used for the passivation layer 116; the thickness of the lower stress buffer layer 118; the material used for the lower stress buffer layer 118; the thickness of the upper stress buffer layer 120; the material used for the upper stress buffer layer 120; the amount of overlap between the lower stress buffer layer 118 and the passivation layer 116; the amount of overlap between the upper stress buffer layer 120 and the lower stress buffer layer 118; the amount of overlap between the conductive connection element 110 and the upper stress buffer layer 120; the slope angle of the sidewall 146 of the upper stress buffer layer 120; the slope angle of the sidewall 144 of the lower stress buffer layer 118; the slope angle (if any) of the sidewall 140 of the passivation layer 116; the shape and size of the via 134 formed in the passivation layer 116; the shape and size of the via 136 formed in the lower stress buffer layer 118; the shape and size of the via 138 formed in the upper stress buffer layer 120; the number of steps in the stepped via 130; the number of stress buffer layers; the thickness of the underbump metallization 112; the composition of the underbump metallization 112; etc.

Figure 3:
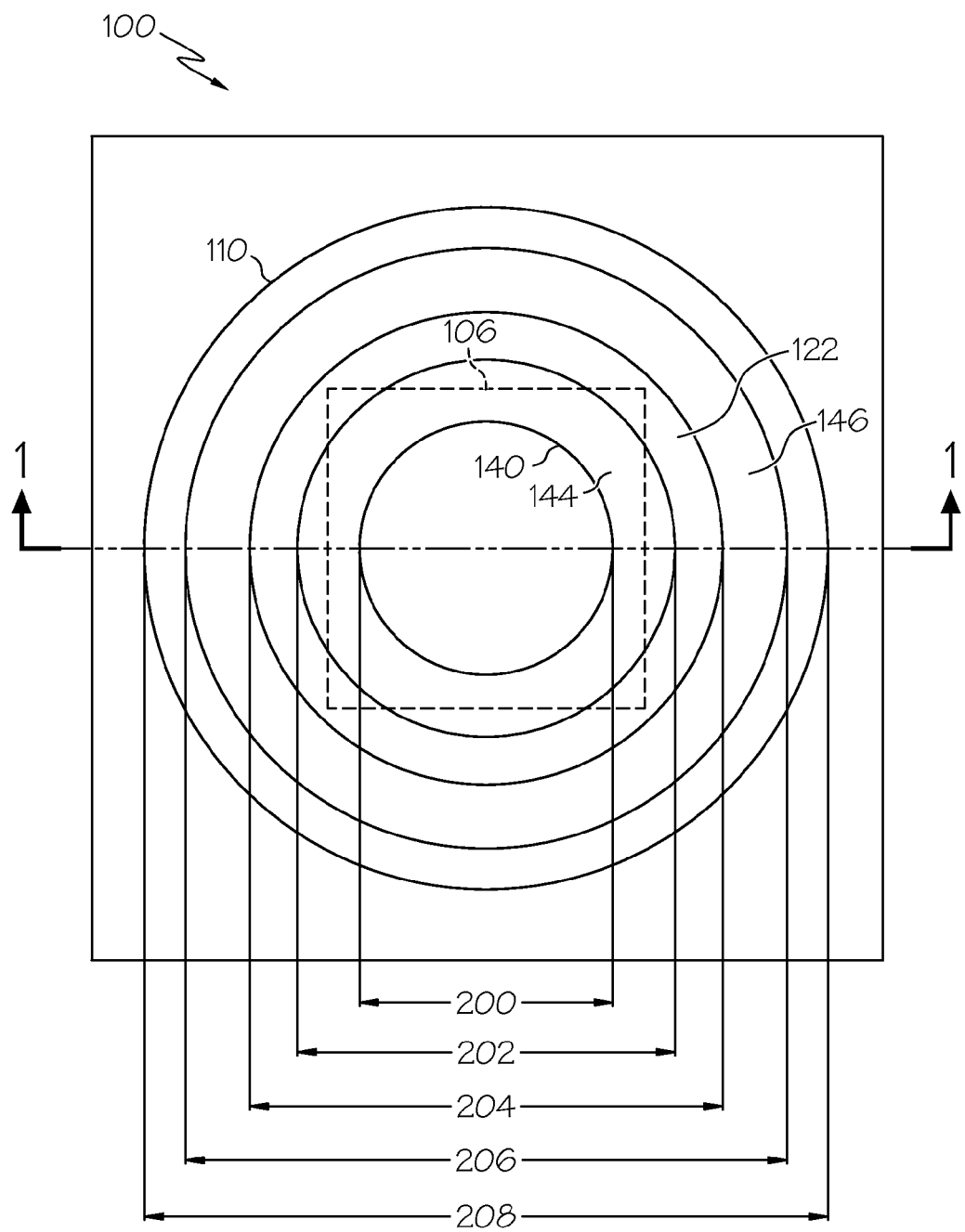
FIG. 3 is a diagram corresponding to a top phantom view of the semiconductor device shown in FIG. 1.

FIG. 3 is a diagram corresponding to a top phantom view of the semiconductor device 100. FIG. 3 is intended to illustrate the spatial relationships of certain features of the stress buffer arrangement 108. Accordingly, for clarity and ease of description, FIG. 3 does not show the underbump metallization 112. Although not always required, the vias 134, 136, 138 that together form the stepped via 130 are circular and concentric. It should be appreciated that one or more of these vias could be non-circular, e.g., oval, elliptical, or polygonal in shape.

FIG. 3 indicates the vertical sidewall 140 of the via 134 defined in the passivation layer 116. The diameter of this sidewall 140 also corresponds to the width or diameter 200 of the lower end of the angled sidewall 144 (and the lower end of the via 136) defined in the lower stress buffer layer 118. FIG. 3 also indicates the width or diameter 202 of the upper end of the angled sidewall 144 (and the upper end of the via 136) defined in the lower stress buffer layer 118. Similarly, FIG. 3 indicates the width or diameter 204 of the lower end of the angled sidewall 146 (and the lower end of the via 138) defined in the upper stress buffer layer 120, and the width or diameter 206 of the upper end of the angled sidewall 146 (and the upper end of the via 138) defined in the upper stress buffer layer 120. The outermost circle shown in FIG. 2 represents the outer boundary of the conductive connection element 110. This outermost circle also corresponds to the lateral cross-sectional width or diameter 208 of the underbump metallization 112. Notably, the upper lateral cross-sectional width 202 of the via 136 formed in the lower stress buffer layer 118 is greater than its lower lateral cross-sectional width 200. Similarly, the upper lateral cross-sectional width 206 of the via 138 formed in the upper stress buffer layer 120 is greater than its lower lateral cross-sectional width 204. The inwardly sloped nature of the vias 136, 138 results in these characteristics. Moreover, the lower lateral cross-sectional width 204 of the via 138 formed in the upper stress buffer layer 120 is greater than the upper lateral cross-sectional width 202 of the via 136 formed in the lower stress buffer layer 118. The stepped configuration of the stress buffer arrangement 108 results in these characteristics.

FIG. 3 also illustrates the concentric configuration of the features of the stress buffer arrangement 108. In this regard, the stepped via 130 has a plurality of inwardly sloped and concentric sections in a stacked orientation, as defined by the upper stress buffer layer 120 and the lower stress buffer layer 118. In particular, the lower inwardly sloped and concentric section of the stepped via 130 (i.e., the via 136) is formed in the lower stress buffer layer 118, and the upper inwardly sloped and concentric section of the stepped via 130 (i.e., the via 138) is formed in the upper stress buffer layer 120. In addition, the lowermost section of the stepped via 130 (i.e., the via 134) is a concentric section that is defined in the passivation layer 116. As mentioned above, the upper concentric section of the stepped via 130 extends to the intermediate concentric section, which in turn extends to the lower concentric section.

EXAMPLE

A preferred embodiment of the semiconductor device 100 may be fabricated with the following exemplary dimensions, which are not intended to be limiting of the disclosed subject matter in any way. This particular example corresponds to a solder bump that utilizes underbump metallization having a diameter of 105 µm. This diameter 208 is depicted in FIG. 3. For this 105 µm bump size, the lower stress buffer layer 118 and the upper stress buffer layer 120 are both 4 µm thick, and the passivation layer 116 is 900 nm thick. The sidewall slope defined in the lower stress buffer layer 118 is 40 degrees, and the sidewall slope defined in the upper stress buffer layer 120 is also 40 degrees.

For this example, the width of the square contact pad 106 is 5 µm, the diameter of the via 134 formed in the passivation layer 116 is 47 µm (reference number 200 in FIG. 3 corresponds to this dimension), the diameter at the top of the via 136 formed in the lower stress buffer layer 118 is 56 µm (reference number 202 in FIG. 3 corresponds to this dimension), the diameter at the bottom of the via 138 formed in the upper stress buffer layer 120 is 76 µm (reference number 204 in FIG. 3 corresponds to this dimension), and the diameter at the top of the via 138 formed in the upper stress buffer layer 120 is 85 µm (reference number 206 in FIG. 3 corresponds to this dimension). Accordingly, the "overlap" dimension between the conductive connection element 110 and the lower stress buffer layer 118 is 10 µm (i.e., the width of the upper shelf 122 is 10 µm). Similarly, the "overlap" dimension between the conductive connection element 110 and the top flat surface of the upper stress buffer layer 120 is 10 µm.

Second Embodiment

Figure 4:
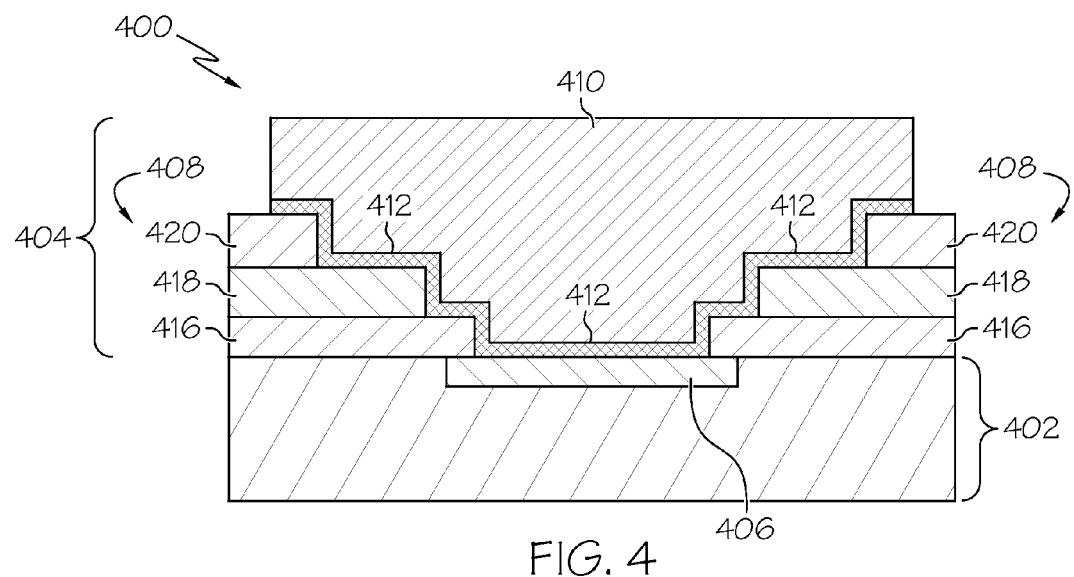
FIG. 4 is a cross-sectional view of another exemplary embodiment of a semiconductor device.
Figure 5:
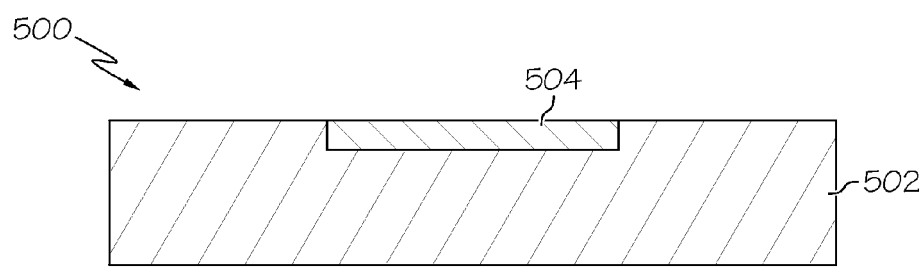
FIGS. 5-12 are cross-sectional views that illustrate a semiconductor device and its related manufacturing process.
Figure 6:
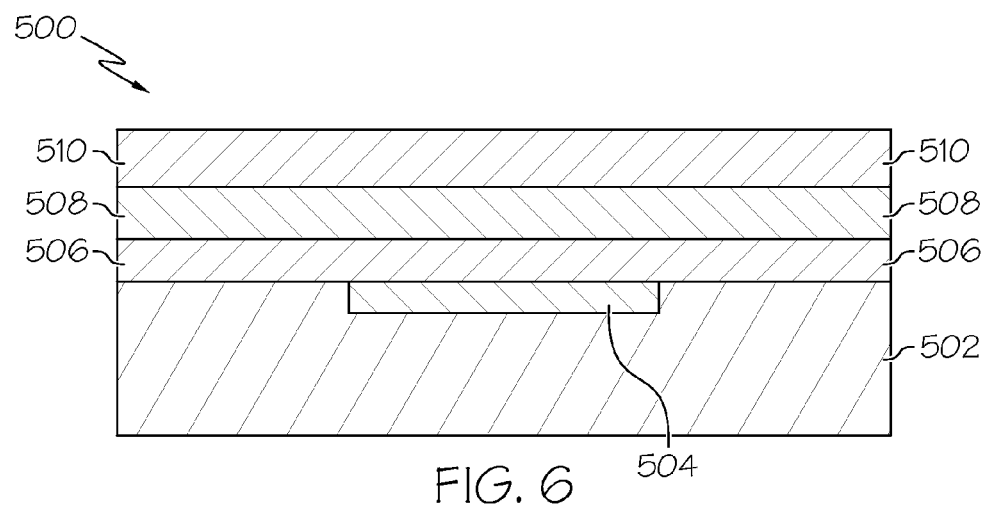

FIG. 4 is a cross-sectional view of another exemplary embodiment of a semiconductor device 400. A number of features and characteristics of the semiconductor device 400 are similar or identical to those described above for the semiconductor device 100 (for the sake of brevity, common features and characteristics will not be redundantly described here in the context of the semiconductor device 400). The semiconductor device 400 includes a semiconductor device structure 402 and a conductive connection structure 404 having a stress buffer arrangement 408 with a stepped profile. The conductive connection structure 404 includes a conductive connection element 410, underbump metallization 412, a passivation layer 416, a lower stress buffer layer 418, and an upper stress buffer layer 420.

The longitudinal cross-sectional profile of the stress buffer arrangement 408 includes a plurality of discrete steps (three vertical steps in this example). Notably, the stress buffer arrangement 408 exhibits sidewalls that are orthogonal to the major upper surface of the contact pad 406, which is in contrast to the sloped profile employed by the stress buffer arrangement 108 used in the semiconductor device 100. Although sloped steps are preferred to reduce the concentration of stresses, a vertically stepped profile as depicted in FIG. 4 could be implemented with good stress reduction results.

It should be appreciated that the actual cross-sectional profile of the stress buffer arrangement in a semiconductor device could vary from that depicted in the figures. For example, an alternate embodiment could utilize a "hybrid" arrangement where at least one layer includes a sloped via sidewall and at least one layer includes an orthogonal via sidewall. In other embodiments, it may be possible to create a curved via sidewall in one or more layers, which would be desirable to further reduce stress concentration effects. Moreover, any number of discrete passivation layers and any number of discrete stress buffer layers could be used in an embodiment of a stress buffer arrangement.

Fabrication Process

FIGS. 5-12 are cross-sectional views that illustrate a semiconductor device 500 and its related manufacturing process. For simplicity and consistency, the semiconductor device 500 is similar to the semiconductor device 100 described above. Accordingly, features, elements, properties, and characteristics described above for the semiconductor device 100 will not be redundantly described here in the context of the manufacturing process.

The fabrication process begins by forming or otherwise providing a semiconductor device structure 502. The semiconductor device structure 502 includes at least one conductive contact pad 504 formed therein. The process continues by forming one or more layers of material overlying the semiconductor device structure 502 and overlying the contact pad 504 (see FIG. 6). This example forms three distinct layers: a layer of passivation material 506; a lower layer of stress buffering material 508; and an upper layer of stress buffering material 510. The passivation material 506 (e.g., a silicon oxide material or a silicon nitride material) is formed overlying the semiconductor device structure 502 and overlying the contact pad 504. In practice, the passivation material 506 can be deposited to the desired thickness using any well known and established material deposition technique such as, without limitation: atomic layer deposition (ALD), chemical vapor deposition (CVD), low pressure CVD (LPCVD), subatmospheric pressure CVD (SACVD), or plasma-enhanced CVD (PECVD). Thereafter, the stress buffering material 508 is formed overlying the deposited layer of passivation material 506. In practice, the stress buffering material 508 can be deposited to the desired thickness using any well known and established material deposition technique, including any of the techniques listed above. Thereafter, the stress buffering material 510 is formed overlying the deposited lower layer of stress buffering material 508. In practice, the stress buffering material 510 can be deposited to the desired thickness using any well known and established material deposition technique, such as a spin coating process.

Figure 7:
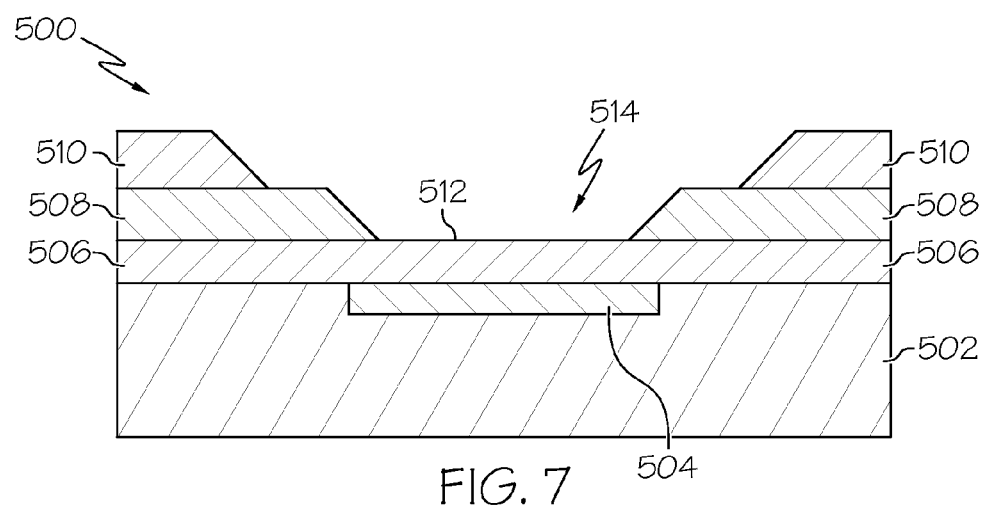

Although other fabrication steps or sub-processes may be performed after the formation of the upper layer of stress buffering material 510, this example continues by removing some of the stress buffering material 510 and some of the stress buffering material 508 to expose a portion 512 of the layer of passivation material 506 (see FIG. 7). FIG. 7 depicts the state of the semiconductor device 500 after formation of a recess 514 in the stress buffering material 508, 510. Notably, the recess 514 is formed such that it exhibits a stepped cross-sectional profile having the inwardly sloped sidewall features (as described above). In practice, the recess 514 may be created using at least two different approaches.

The stress buffering material is a photosensitive material (e.g., a polyimide that contains a negative-tone photosensitive component) that can be photolithographically processed, as is well understood. For the first approach, before depositing the upper layer of stress buffering material 510, the lower layer of stress buffering material 508 is photolithographically exposed in a selective manner using an appropriate light source. Thereafter, the upper layer of stress buffering material 510 is deposited overlying the exposed (but not yet developed) stress buffering material 508. In other words, the process photolithographically exposes a portion of the lower layer of stress buffering material 508 before forming the upper layer of stress buffering material 510. Thereafter, the upper layer of stress buffering material is photolithographically exposed in a selective manner using an appropriate photolithographic technique. Next, the photolithographically exposed upper layer of stress buffering material 510 and the photolithographically exposed lower layer of stress buffering material 508 are developed (etched) together to form the recess 514. In practice, both of these layers are developed concurrently using the same developing chemistry.

For the second approach, the upper layer of stress buffering material 510 is deposited overlying the unexposed and undeveloped lower layer of stress buffering material 508. Thereafter, the two layers of stress buffering material are photolithographically exposed and developed in a sequential manner. Accordingly, the process photolithographically exposes a portion of the upper layer of stress buffering material 510 and then develops the exposed stress buffering material 510 to reveal some of the lower layer of stress buffering material 508. Thereafter, the process photolithographically exposes a portion of the revealed stress buffering material 508 and then develops the exposed stress buffering material 508. Developing the stress buffering material 508 reveals the portion 512 of the layer of passivation material 506, as shown in FIG. 7.

Certain parameters, control settings, the chemistry, the etch timing, and/or other factors associated with the exposing and/or developing step(s) described above are configured or selected to obtain the desired inwardly sloped profile for the stress buffering material 508, 510. For example, the exposure parameters (exposure energy, exposure time, etc.), the hot plate temperature used during developing, and/or the developer chemistry can be controlled to produce the inwardly sloped characteristics and to control the resulting slope angle (s). The sloped profile is primarily created by a combination of exposure time and intensity. Further fine tuning can be achieved by adjusting the combination of polyimide pre-bake time and temperature, the developing time, and/or the chemistry used during developing.

Figure 8:
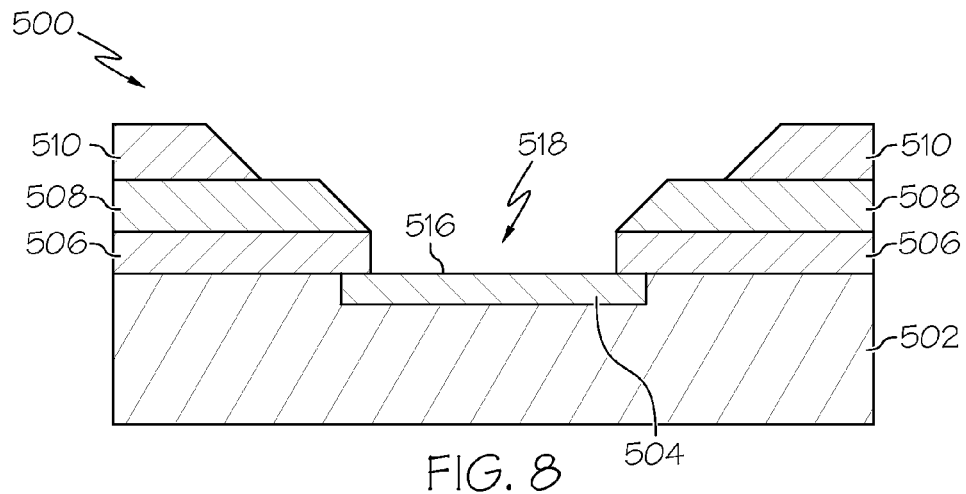

After creation of the recess 514, the fabrication process may continue by selectively etching the layer of passivation material 506 to expose at least a portion 516 of the contact pad 504 (see FIG. 8). The etching of the passivation material 506 is performed using the upper layer of stress buffering material 510, the lower layer of stress buffering material 508, and the recess 514 as an etch mask. Moreover, the passivation material 506 is selectively etched using an anisotropic etch chemistry that selectively removes the passivation material 506 without removing a significant amount of the other exposed materials and without removing a significant amount of the contact pad 504. As a result of this etching step, the recess 514 is extended downward, resulting in an extended recess 518.

Figure 9:
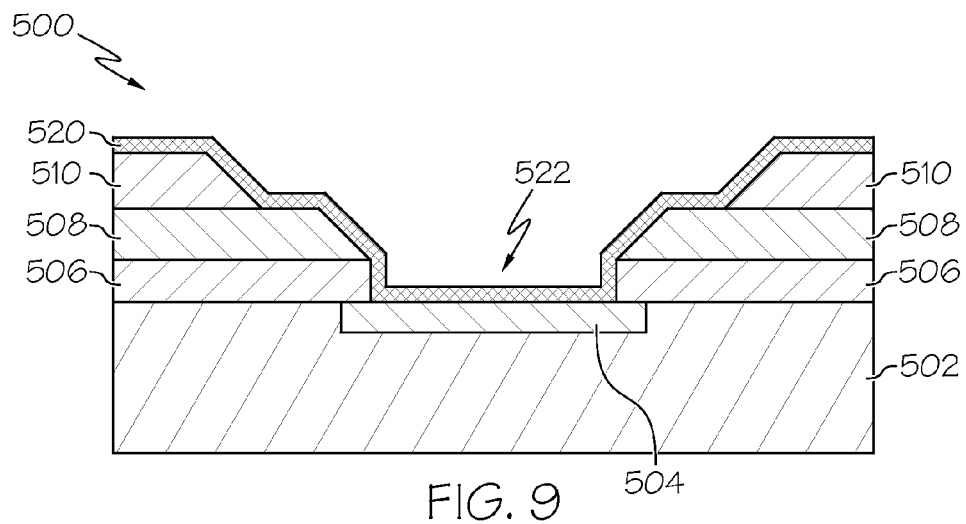

Thereafter, the extended recess 518 is lined with underbump metallization 520 (see FIG. 9). In practice, the underbump metallization 520 can be realized using one or more layers of different materials such as titanium, copper, nickel, tungsten, silver, and alloys thereof. Thus, the underbump metallization 520 may be formed by one or more deposition processes (such as sputter deposition and/or evaporation), depending upon the requirements of the particular application. As depicted in FIG. 9, the underbump metallization 520 is conformally deposited to form a lined recess 522.

Figure 10:
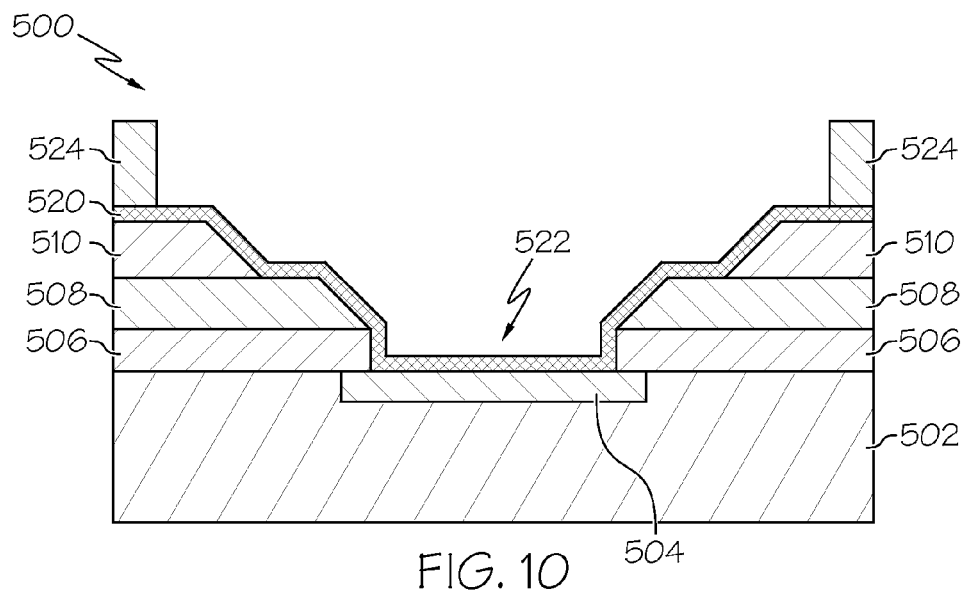
Figure 11:
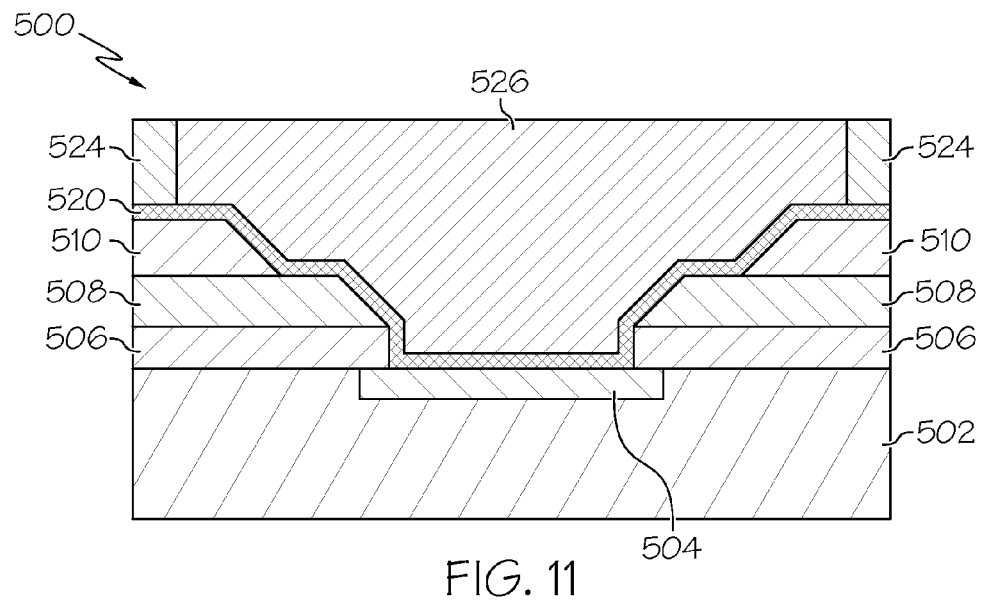
Figure 12:
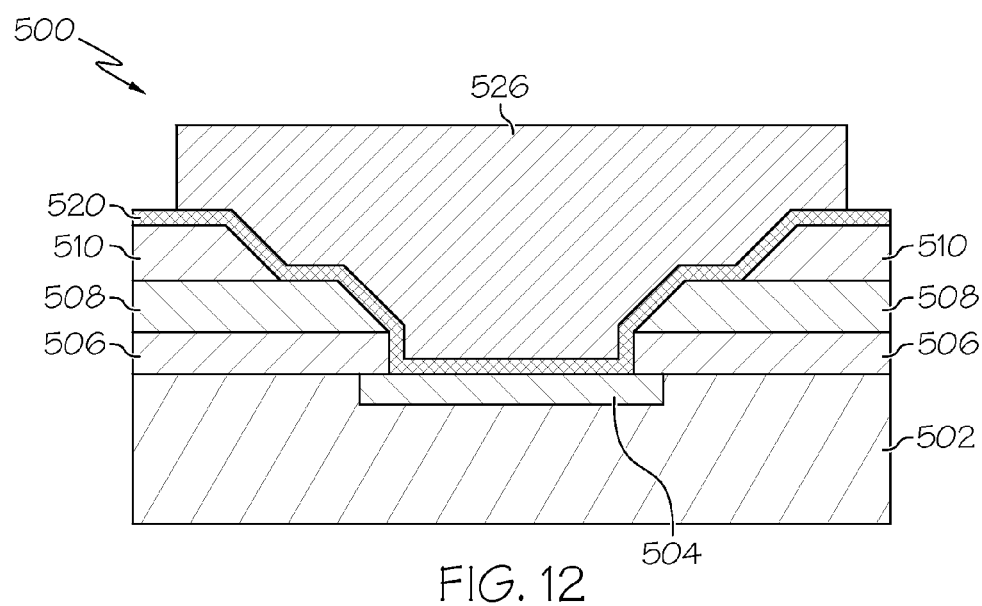

Next, a photolithography process can be performed to create a mask 524 having features that expose a portion of the underbump metallization 520 (see FIG. 10). In this regard, the mask 524 leaves the lined recess 522 exposed. Thereafter, conductive material 526 is formed in the lined recess 522 (see FIG. 11). FIG. 11 depicts the state of the semiconductor device 500 after the lined recess 522 has been filled with the conductive material 526. In practice, the conductive material 526 is deposited by electroplating an appropriate metal or metal alloy material. After depositing the desired amount of conductive material 526, the mask 524 is removed in an appropriate manner, for example, by etching. FIG. 12 depicts the state of the semiconductor device 500 after removal of the mask 524. Thereafter, the semiconductor device 500 can be subjected to another etching step to remove the unwanted portions of the underbump metallization 520. In practice, the conductive material 526 serves as an etch mask during a plasma etch process to remove the excess underbump metallization 520. After this etch process, the semiconductor device 500 will resemble that shown in FIG. 1. It should be appreciated that additional process steps can be performed at this time, for example, cleaning, reflow, testing, assembly, and the like.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
   forming a semiconductor device structure comprising a contact pad;
   forming a layer of passivation material overlying the semiconductor device structure and overlying the contact pad;
   forming a layer of first stress buffering material overlying the layer of passivation material;
   exposing a portion of the layer of first stress buffering material, resulting in exposed and undeveloped first stress buffering material;
   forming a layer of second stress buffering material overlying the exposed and undeveloped first stress buffering material;
   exposing a portion of the layer of second stress buffering material, resulting in exposed and undeveloped second stress buffering material;
   concurrently developing the exposed and undeveloped second stress buffering material and the exposed and undeveloped first stress buffering material to remove some of the second stress buffering material and some of the first stress buffering material to expose a portion of the layer of passivation material, resulting in a recess having a stepped cross-sectional profile;
   selectively etching the layer of passivation material using the first stress buffering material, the second stress buffering material, and the recess as an etch mask, to expose at least a portion of the contact pad; and thereafter forming a conductive connection element overlying the recess.

2. The method of claim 1, wherein forming a conductive connection element comprises:

lining the recess with underbump metallization, resulting in a lined recess; and forming conductive material in the lined recess.

3. The method of claim 1, wherein concurrently developing comprises:

removing some of the second stress buffering material to create an inwardly sloped recess sidewall in the layer of second stress buffering material; and removing some of the first stress buffering material to create an inwardly sloped recess sidewall in the layer of first stress buffering material;

wherein the inwardly sloped recess sidewall in the layer of second stress buffering material and the inwardly sloped recess sidewall in the layer of first stress buffering material are discontinuous.

4. The method of claim 1, wherein concurrently developing comprises:

removing some of the second stress buffering material to create a second recess sidewall in the layer of second stress buffering material, the second recess sidewall being orthogonal to a major surface of the contact pad; and removing some of the first stress buffering material to create a first recess sidewall in the layer of first stress buffering material, the first recess sidewall being orthogonal to the major surface of the contact pad;

wherein the first recess sidewall and the second recess sidewall are discontinuous.

* * * * *